United States Patent [19]
Johnson

[11] Patent Number: 4,611,966
[45] Date of Patent: Sep. 16, 1986

[54] APPARATUS FOR TRANSFERRING SEMICONDUCTOR WAFERS

[76] Inventor: Lester R. Johnson, 411 Fourth St., Radford, Va. 24141

[21] Appl. No.: 615,288

[22] Filed: May 30, 1984

[51] Int. Cl.⁴ .............................................. B65G 65/00
[52] U.S. Cl. .................... 414/404; 294/87.1; 414/226; 414/417
[58] Field of Search ............... 414/287, 403, 404, 416, 414/417, 754, 750, 753, 589, 590, 409, 410, 225, 226, 405; 901/6, 7; 198/775; 29/738; 294/87.1

[56] References Cited

U.S. PATENT DOCUMENTS

| | | | |
|---|---|---|---|
| 3,949,891 | 4/1976 | Butler et al. | 414/405 |
| 4,023,691 | 5/1977 | Perel | 414/403 X |
| 4,466,766 | 8/1984 | Geren et al. | 414/404 |
| 4,466,767 | 8/1984 | Meschi | 414/417 X |
| 4,493,606 | 1/1985 | Foulke et al. | 414/404 X |
| 4,500,407 | 2/1985 | Boys et al. | 414/416 X |
| 4,566,839 | 1/1986 | Butler | 414/404 |
| 4,568,234 | 2/1986 | Lee et al. | 414/404 |

FOREIGN PATENT DOCUMENTS

| | | | |
|---|---|---|---|
| 19673 | 2/1979 | Japan | 414/287 |
| 99738 | 7/1980 | Japan | 414/287 |

Primary Examiner—Joseph E. Valenza
Assistant Examiner—David A. Bucci
Attorney, Agent, or Firm—H. Gordon Shields

[57] ABSTRACT

Semiconductor wafers are transferred from and to holder elements or "boats", in which the wafers are processed, by transfer apparatus including a movable head having rotatable holder elements which hold the wafers. Wafers are moved out of and into the boats by vertically moving lifting elements. The lifting elements move the wafers from a boat to the rotatable holder elements, and vertical lifting elements move the wafers from the rotatable holder elements into boats after the head has moved itself from one position to another. Typically, there are three positions or stations for the head, and vertical lifting elements are positioned at each station for moving the wafers vertically to and from the boats which are located at each station.

16 Claims, 13 Drawing Figures

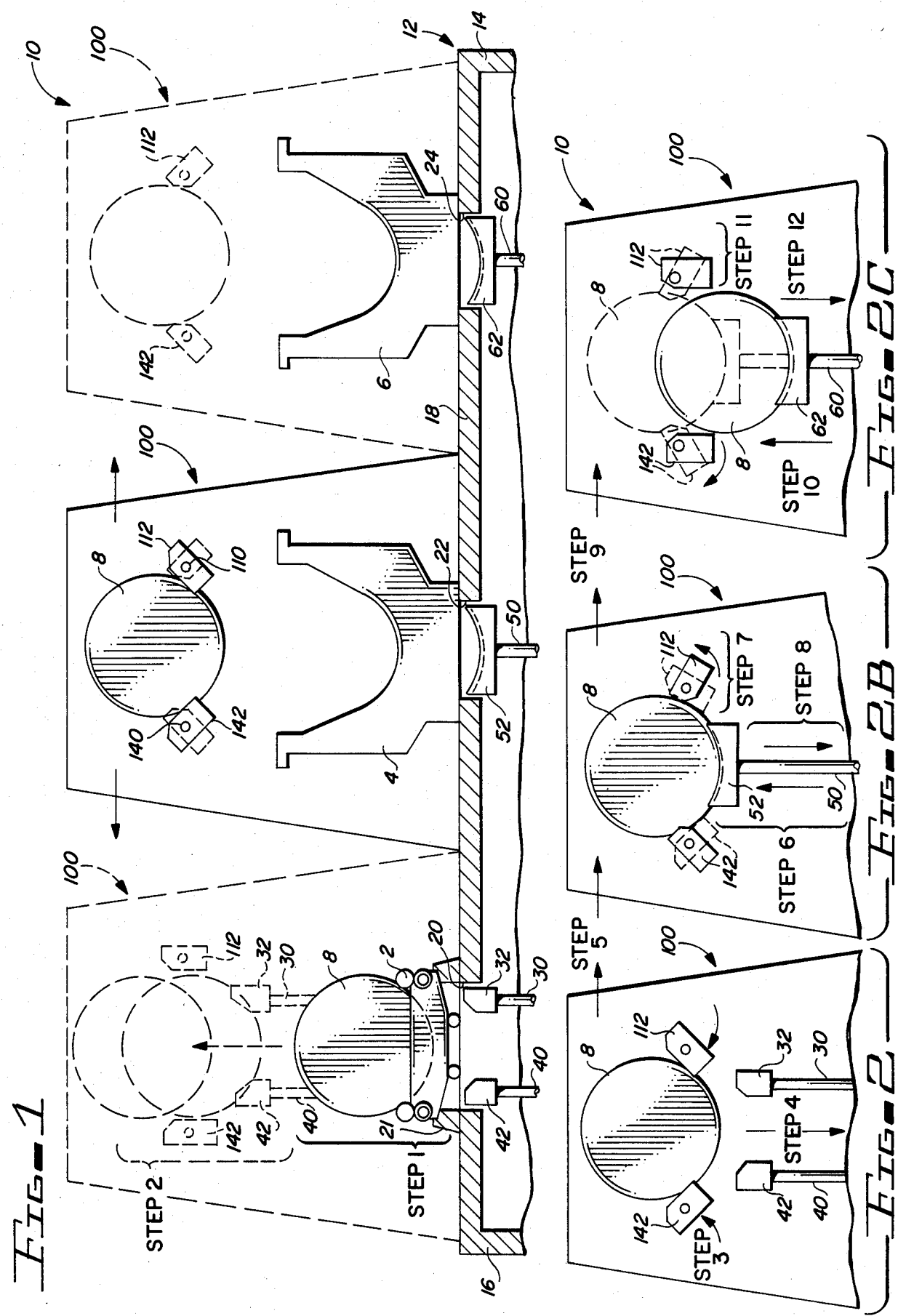

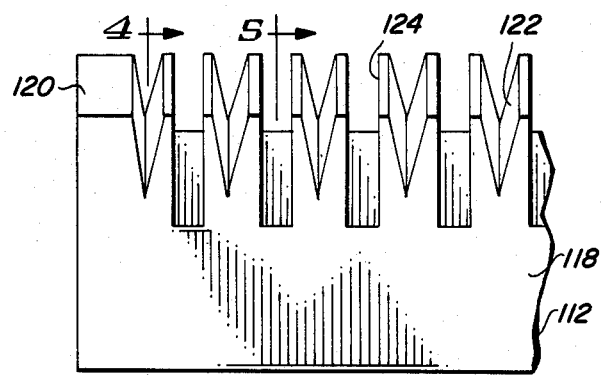
FIG.-3
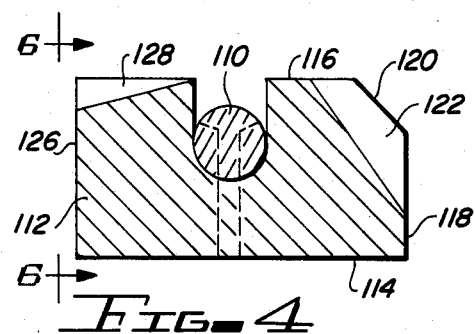
FIG.-4
FIG.-5
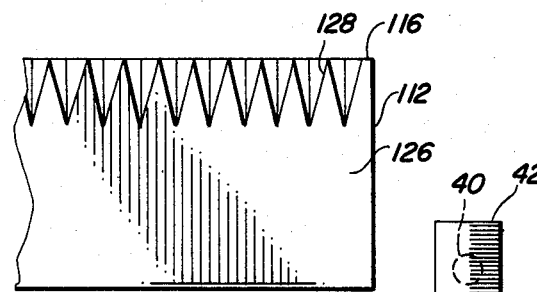
FIG.-6
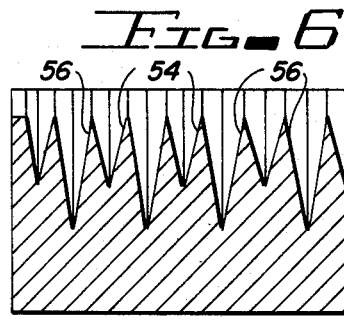
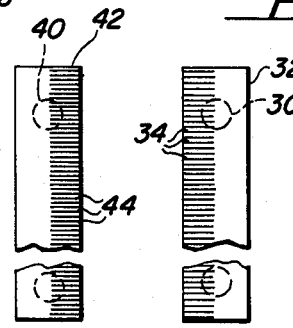
FIG.-7
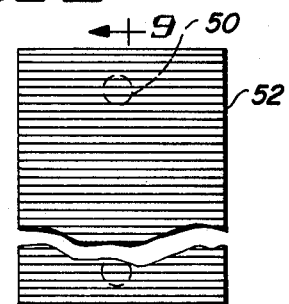
FIG.-8
FIG.-9
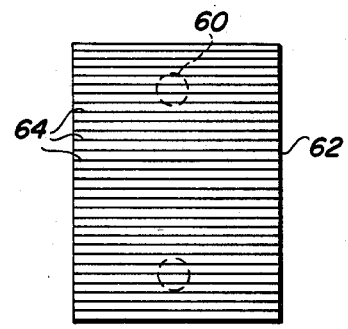
FIG.-10
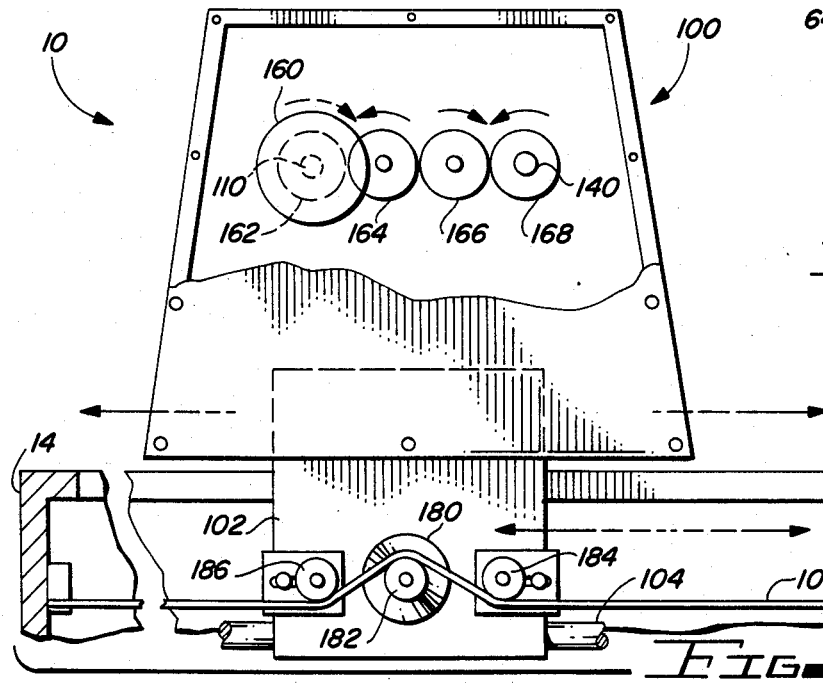
FIG.-11

APPARATUS FOR TRANSFERRING SEMICONDUCTOR WAFERS

BACKGROUND OF THE INVENTION

1. Field of the Invention

This invention relates to semiconductor wafer transfer apparatus and, more particularly, to transfer apparatus for moving semiconductor wafers vertically and horizontally to transfer the wafers from one location or station to another.

2. Description of the Prior Art

Semiconductor discs or wafers, made of silicon and other materials, are the primary ingredient of semiconductor chips. Many, many chips can be made from a single wafer. During the manufacturing of integrated circuits, the wafers are processed numerous times. The wafers accordingly must be transferred between containers or holding elements numerous times for the various manufacturing steps.

The containers or holders are typically referred to in the industry as "boats". There are primarily two kinds of boats. One kind of boat is a quartz boat. It is used to hold the silicon wafers when the wafers are processed in ovens. For other processing, such as when chemical baths are used to treat the wafers, plastic boats are used.

For purposes of quality control, it is preferable to have the silicon wafers transferred automatically, without the intervention of human hands. Each time a wafer is touched by a human hand, even a gloved hand, there is danger of both breakage and contamination. As will be understood, the silicon wafers are relatively thin and fragile, and thus are susceptible to breakage. It is accordingly desirable that the wafers be transferred from quartz boats to plastic boats, and vice-versa, by automated machinery.

Typically, the silicon wafers in boats are quite close to each other. A typical quartz boat will hold fifty wafers. The quartz boats hold the wafers primarily for heating purposes in ovens, and accordingly there does not need to be much space between the wafers. The spacing in plastic boats is about half the density, or about twice as great as the spacing of the wafers in the quartz boats. There are normally about twenty-five wafers per plastic boat. The reason for the difference in spacing is that the wafers in the plastic boats will be subject to acid baths or other chemical processing, etc., and thus greater spacing is required between wafers.

The apparatus of the present invention is concerned with the transfer of the wafers from quartz boats to plastic boats, and from plastic boats to quartz boats. Since there are twice as many wafers in a quartz boat as in a plastic boat, one quartz boat requires two plastic boats to hold the same total number of wafers. The apparatus of the present invention has three stations, one station for a single quartz boat, and two stations for plastic boats.

U.S. Pat. No. 2,083,618 discloses packaging apparatus in which elements to be packaged are carried or are transported in conveyor elements which include cutout portions for receiving the elements to be transported.

U.S. Pat. No. 3,080,955 discloses a conveyor system in which roller elements are used to move fruit. The roller elements include cutout or relieved portions which assist in moving the fruit.

U.S. Pat. No. 3,830,355 discloses apparatus for longitudinally separating cigarettes which are moved on a conveyor system in an end-to-end relationship. The spacing is accomplished by roller elements which include cutout or relieved portions which contact the cigarettes and accelerate them in single file.

U.S. Pat. No. 3,858,708 discloses another type of material handling apparatus in which rollers are used to move cylindrical or rod-like elements.

U.S. Pat. No. 3,976,499 discloses roller apparatus for conveying and cutting sugar cane stocks. A pair of rollers is shown receiving stocks from a conveyor system. The rollers are not round, rather they are of a somewhat squarish cross-section, with convexly extending corner portions.

The patents discussed above generally refer to materials handling or conveying apparatus which include some type of roller mechanism or elements related thereto. However, none of the apparatus shown in the patents is used to convey wafer-like elements, and none of the apparatus utilize roller elements for holding and positioning purposes. Rather, the roller elements are used for conveying articles.

SUMMARY OF THE INVENTION

Among the objects of the present invention are the following:

To provide new and useful wafer transfer apparatus;

To provide new and useful apparatus for transferring silicon wafers from a quartz boat to plastic boats, and vice-versa;

To provide new and useful wafer transfer apparatus having a plurality of vertical lifting elements;

To provide new and useful wafer transfer apparatus having a movable head to transfer the wafers horizontally;

To provide new and useful transfer apparatus having a pair of rotatable holder elements for holding the wafers during horizontal movement of the wafers; and To provide new and useful wafer transfer apparatus having a plurality of vertical lifting elements for moving the wafers vertically to and from rotatable holder elements.

BRIEF DESCRIPTION OF THE DRAWING

FIG. 1 is a schematic representation of a portion of the apparatus of the present invention.

FIGS. 2A, 2B, and 2C are schematic representations illustrating sequentially the steps involved in utilizing the apparatus of the present invention.

FIG. 3 is an enlarged view of a portion of the apparatus of the present invention.

FIG. 4 is a view in partial section taken generally along line 4—4 of FIG. 3.

FIG. 5 is an enlarged view in partial section of a portion of the apparatus of the present invention, taken generally along line 5—5 of FIG. 3.

FIG. 6 is an enlarged view of a portion of the apparatus of the present invention, taken generally along line 6—6 of FIG. 4.

FIG. 7 is a top view of a portion of the apparatus of the present invention.

FIG. 8 is a top view of another portion of the apparatus of the present invention.

FIG. 9 is a view in partial section taken generally along line 9—9 of FIG. 8.

FIG. 10 is a top view of another element of the apparatus of the present invention.

FIG. 11 is a schematic representation of another portion of the apparatus of the present invention.

DESCRIPTION OF THE PREFERRED EMBODIMENT

FIG. 1 is a schematic representation of wafer transfer apparatus 10, illustrating some of the components thereof. The wafer transfer apparatus 10 includes a table 12. The table 12 includes a pair of sides 14 and 16 and a top 18. The top 18 includes three apertures 20, 22, and 24 extending through the top. A pair of support elements 21 are disposed adjacent to the aperture 20 for receiving and positioning a quartz boat 2. The quartz boat 2 includes a plurality of semiconductor discs or wafers 8. The semiconductor wafers 8 are silicon discs or wafers being processed for integrated circuits and the like. Typically, a quartz boat 2 holds fifty wafers 8 in parallel, aligned slots. The quartz boat is made of quartz rods secured together, and the aligned slots extend into the parallel rods for receiving and supporting the wafers 8.

Three pusher units are associated with the table 12. The pusher units include a pair of pusher rods 30 and a pair of pusher rods 40. The pusher rods 30 are secured to a head or pusher element 32, and the pusher rods 40 are secured to a head or pusher element 42. The pusher elements 32 and 42 are spaced apart slightly. The purpose for the spacing apart of the rods and the heads 30, 32 and 40, 42 is to allow the pusher rods and the pusher head elements to move upwardly between the parallel structural rods of the quartz boat 2 for contacting and raising the wafers 8 disposed in the boat 2.

The pusher heads 32 and 42 each include a plurality of parallel and aligned slots corresponding to the number of wafers, namely fifty, held in the boat 2. The slots contact and support the wafer elements 8 when raising the wafer elements above the boat 2 and when lowering the wafer elements 8 back into the boat 2 for transfer purposes. The transfer processes or steps will be discussed in detail below. Similarly, the pusher elements or heads 32 and 42 will be discussed in detail below in conjunction with FIG. 7.

Beneath the aperture 22 is a pair of pusher rods 50 with a single head or pusher element 52 secured to the rods 50. One of the rods 50 is shown in FIGS. 1 and 2. A plastic boat 4 is shown disposed over the aperture 22, and thus above the pusher element 52 and its rods 50.

A plastic boat 6 is shown disposed over the aperture 24. A pair of pusher rods 60 is secured to a pusher head or pusher element 62. The pusher element 62 is shown disposed beneath the aperture 24.

The bottom portions of the plastic boats 4 and 6, which are substantially identical to each other, are open to receive the pusher elements for transferring wafers into and out of the boats. The plastic boats 4 and 6 each have twenty-five pairs of aligned slots for receiving twenty-five wafer elements 8. The twenty-five pairs of slots in each boat are spaced apart from adjacent slots twice as far as the spacing between each of the fifty slots in the quartz boat 2. Thus, the spacing between the wafers in the plastic boats is greater than the spacing between wafers in the quartz boats.

For processing of the wafers 8, the quartz boats 2 are generally used for when the wafers are to be placed in ovens. For washing or chemical or other processing, the wafers 8 are usually placed in the plastic boats 4.

A movable head 100 is shown in FIG. 1 disposed adjacent to the aperture 22. The aperture 22 is in the center of the top 18 of the table 12. The head 100 is shown in dotted line (or phantom) adjacent to the apertures 20 and the apertures 24, for illustrative purposes. Included on the head 100 are a pair of roller rods 110 and 140. Secured to the roller rod 110 is a roller 112, and secured to the roller rod 140 is a roller 142. A wafer disc 8 is illustratively shown supported by the rollers 112 and 142 in FIG. 1.

FIGS. 2A, 2B, and 2C are schematic illustrations showing sequential movements of the head 100. The rotation of the rollers 112 and 142 is also shown in FIGS. 2A, 2B, and 2C.

FIG. 3 is a side view of the roller 112. FIG. 4 is a view in partial section of the roller 112 taken generally along line 4—4 of FIG. 3. FIG. 5 is a view in partial section of the roller rod 112 taken generally along line 5—5 of FIG. 3. FIG. 6 is a view of the roller rod 112 taken generally along line 6—6 of FIG. 4. FIG. 7 is a top view of the pusher elements 32 and 42. FIG. 8 is a top view of the pusher element 52. FIG. 9 is a view in partial section of the pusher element 52 taken generally along line 9—9 of FIG. 8. FIG. 10 is a top view of the pusher element 62.

FIG. 11 is a schematic representation of the table 12 and the movable head 100. FIG. 11 is a back or rear view of the table 12 of the apparatus 10, illustrating the actuation of the roller elements and of the head 100.

Details of the roller 112 are shown enlarged in FIGS. 3, 4, 5, and 6. The roller 112 is substantially identical to the roller 142, except that they face each other and thus are mirror images of each other. The following detailed description of roller 112 accordingly also applies to roller 142. The roller 112 is generally of a rectangular configuration, with the roller rod 110 disposed generally centrally. The roller 112 includes a flat outer side 114 and an inner side 116 which is open in the center to receive the rod 110. The roller 112 includes a plurality of alternating grooves 122 and 124 which extend obliquely away from the side 116, and a plurality of V-shaped grooves 128 on the opposite side of the rod 110 from the alternating grooves 122 and 124. The grooves 122 are generally V-shaped and are generally shallow, as best shown in FIG. 3. The grooves 124 are generally rectangularly configured grooves which are substantially deeper than the V-shaped grooves 122. This may be seen in FIGS. 3, 4, and 5. The grooves 122 and 124 extend generally diagonally or obliquely away from the inner side 116, and terminate at a top side or surface 118. The corner between the sides 116 and 118 is cut at a diagonal to define a corner surface 120. The grooves 122 and 124 extend downwardly from the surface 120 into the roller 112.

At the opposite end of the roller 112 from the top surface 118 is a bottom surface 126. The V-shaped grooves 128 extend from the top surface 118 at a diagonal angle between the inner surface 116 and the bottom surface 126. There are fifty of the grooves 128, twenty-five of the grooves 122, and twenty-five of the grooves 124. The V-shaped grooves 128 are relatively shallow, as are the V-shaped grooves 122. The rectangular grooves 124 are deeper than the grooves 122, as best shown in FIG. 3. The grooves 122 and 124 are aligned with the grooves 128. The grooves 122 and 124 are spaced apart equal distances from each other.

The pusher heads or elements 32 and 42 each include fifty equally spaced apart and aligned grooves 34 and 44, respectively. The spacing between the adjacent grooves 34 and between the adjacent grooves 44 is the same as the spacing between the adjacent grooves 128, and also the same as the spacing between the adjacent grooves 122 and 124. The grooves 122 and 124 are staggered or altered so that the spacing between the grooves 122 is twice as far apart as the spacing between the grooves 128 and the spacing between the grooves 34 and 44 of the pusher pair 32, 42. The grooves 124 are similarly double-spaced as far as the grooves 128 and the grooves 34 and 44 are concerned.

The pusher element 52 also includes fifty grooves, which are equally spaced apart. However, the grooves in the pusher head or element 52 are alternating shallow and deep. This is shown best in FIG. 9. The pusher element 52 includes twenty-five relatively shallow V-shaped grooves 54 interleaved with twenty-five relatively deep V-shaped grooves 56. The shallow and deep slots or grooves 54 and 56 are generally parallel and aligned with the respective interleaved shallow and deep grooves of the rollers 112 and 142, such as the grooves or slots 122 and 124 of the roller 112.

The pusher head or element 62 includes twenty-five grooves 64. The grooves 64 are V-shaped grooves and spaced apart a double width. The double width is, of course, the same distance as between two shallow grooves 54 or two deep grooves 56 of the pusher head 52. This is also the same distance as between two shallow slots or grooves 122 or two deep slots or grooves 124 for the roller 112, and, of course, the same distance for the corresponding slots or grooves in the roller 142.

Referring now to FIGS. 1 and 2A, B, and C, the transfer of wafers 8 will be discussed. It will be noted that the sequential steps are shown in FIGS. 1, 2A, 2B, and 2C and identified as steps 1 through 12.

For unloading a quartz boat, such as the boat 2, loaded with fifty silicon wafers 8, the loaded quartz boat 2 is placed on the support element 21 on the top 18 of the table 12 and over the aperture 20. This comprises step one. The dual pushers 32 and 42 will be in their down position, as shown in FIG. 1. The head 100 is brought to the position shown in phantom in FIG. 1 from the neutral position in the center of the table 12. The head 100 is shown in the neutral position in FIG. 1. However, when the head 100 is in the neutral position, centered on the table 12, the rollers 112 and 142 are generally vertically oriented, as shown in FIG. 2C. The rollers 112 and 140 remain disposed generally vertically, as shown in phantom in FIG. 1, when the head 100 moves to the first station adjacent to the aperture 20 and the boat 2. Once actuated, the sequence of events is accomplished automatically under the control of a preprogrammed microprocessor (not shown). The sequential stops may also be accomplished under manual control, if desired.

After the boat 2, with its wafers 8, is disposed on the table 12 over the aperture 20, and the head 100 is moved to its position, as shown, adjacent to the boat 2, and to the aperture 20, the pusher rods 30 and 40 move upwardly. This is the second step in the unloading process or sequence. As the pusher heads or elements 32 and 42 move upwardly, they contact the wafers 8 in the boat 2. The pushers 32 and 42, and their respective pusher rod pairs 30 and 40, move upwardly through or within the boat 2. The slots or grooves in the pushers 32 and 42 receive the silicon wafers 8 and move them upwardly, as shown in phantom in FIG. 1. The wafers 8 are raised to the uppermost position shown in phantom, which is above the rollers 112 and 140.

After the pushers 32 and 42 have stopped their upward travel, raising the wafers 8 above the rollers 112 and 142, the rollers rotate on their respective rods 110 and 140 so that their bottom surfaces are generally pointing toward each other. In this position, the vertical axes of the rollers are generally oriented in a wide V-shape. When the rollers 112 and 142 are in this position, the equally spaced bottom V-slots or grooves such as, or including, the slots or grooves 128 of the roller 112, are ready to receive the fifty wafers. This is the third step.

After the rollers are in the "V" position, as shown in FIG. 2A, the pusher rods 30 and 40 move downwardly. This is the fourth sequential step. As the wafers 8 move downwardly with the pusher elements, the wafers contact the relatively shallow V-slots and the wafers remain in the grooves of the rollers 112 and 142. The pusher rods 30, 40, and their respective pusher heads 32, 42, continue their downward travel until they are in the retracted position shown in FIG. 1, disposed beneath the surface of the table 12.

The head 100 then moves from its position adjacent to the aperture 20 to the second station at the center position, adjacent to the aperture 22, and with a plastic boat 4 in position over the aperture 22, the pusher rods 50 move upwardly, moving the head or pusher element 52 upwardly through the boat 4 to make contact with the fifty wafers 8. This comprises step six.

As indicated above, and as shown in FIG. 9, the fifty grooves in the pusher element or head 52 are equally spaced, but some of the grooves are shallow and some of the grooves are deep. The pusher element 52 is moved upwardly by the rods 50 until the wafers 8 are disposed in the grooves 54 and 56 of the element 52.

The pusher element 52 continues its upward movement after the wafers are disposed in the grooves until the wafers are clear of the rollers 112 and 142. Thus, the slots or grooves 54 and 56 of the pusher element 52 receive the wafers 8 and move them upwardly, out of the slots 128 in the roller 112 and the corresponding slots in the roller 142.

When the pusher rods 50 are at their maximum upward height, and the wafers 8 are in the grooves or slots 54 and 56, and thus are free or clear from the grooves in the rollers 112 and 142, the rollers rotate ninety degrees counterclockwise and clockwise respectively, from the "V" position shown in solid line in FIG. 2A and in phantom in FIG. 28 to the position shown in solid line in FIG. 2B. The rotation of the rollers 112 and 142 comprises step seven in the sequence.

After the rollers 112 and 142 have completed their rotation, the pusher rods 50 move downwardly, taking the head or pusher element 52 with them. This comprises step eight. The wafers 8 move downwardly with the pusher rods 50 and their head or element 52. The rollers 112 and 142, now rotated ninety degrees, present to the wafers the alternating shallow and narrow slots 122 and deep and wide slots 124 in the roller element 112, and the corresponding shallow and narrow slots and the deep and wide slots in the pusher element 142.

The depth of the rectangularly configured wide slots 124 and their corresponding slots in the roller 142 is sufficient to allow the wafer elements 8 to move downwardly through them. The depth of the shallow vee slots 122 and their corresponding slots in the roller 142 is not sufficient depth to allow the wafers 8 to move downwardly through them. Rather, the shallow and narrow vee slots receive twenty-five of the wafers 8, while the other twenty-five wafers move downwardly through the deep and wide slots 124 and thus move downwardly into the boat 4 with the pusher element 52.

Within the boat 4 are twenty-five slots which receive the twenty-five wafers moving downwardly with the pusher element 52.

The reason for the rectangular configuration of the deep slots 124 is thus understood. The rectangular cut of the relatively deep slots provides sufficient width, uniform throughout a slot, for a wafer to pass through the slot unimpeded. Half of the wafers are thus free from contact with the two rollers as the pusher head 52 moves downwardly, and half (namely twenty-five) of the wafers 8 accordingly move downwardly with the head 52, and the remaining half or twenty-five of the wafers remain in the twenty-five pairs of shallow vee grooves in the rollers 112 and 142.

The relatively shallow vee grooves or slots 54 are aligned with the shallow vee grooves or slots in the rollers, including the grooves or slots 122 of the roller 112. The wafers 8 disposed in the grooves or slots 54 move into the shallow grooves in the rollers and remain there as the pusher 52 continues downward. The twenty-five wafers are thus transferred from the rollers to the pusher and back to the rollers.

The relatively deep vee grooves or slots 56 are aligned with the rectangularly configured and relatively wide and deep grooves in the rollers 112 and 142, including the grooves 124 in the roller 112. The wafers 8 disposed in the grooves 56 of the pusher 52 move downwardly with the pusher through the rectangularly configured grooves in the rollers and remain in the pusher and are deposited into the awaiting grooves or slots in the boat 4.

After the pusher head 52 is moved to its downward position, as shown in FIG. 1, the head 100 once more moves to the third station or position shown in dotted line in FIG. 1, adjacent to the aperture 24 and adjacent to the boat 6. The boat 4, at station two, over the aperture 22, and loaded with twenty-five silicon wafers 8, is then ready to be removed for further processing of the wafers.

With the rollers 112 and 142 rotated so that the top or upper portions of the rollers are pointing generally towards each other, as shown in FIG. 2B, and as also shown in phantom in FIG. 1 over the aperture 24, the general configuration of the rollers 112 and 142 is an inverted "V". The rollers maintain this orientation as they transport or move the remaining twenty-five wafers as the head 100 moves from the second station at the aperture 22 to adjacent the aperture or opening 24 at station three. This is shown in phantom in FIG. 1, and is shown in solid line in FIG. 2C. This transport move comprises the ninth step in the sequence.

The rollers 112 and 142 maintain their inverted vee position, holding the remaining twenty-five wafers 8, while the pushers 60 and pusher element 62 move upwardly. As the pusher element 62 moves upwardly, its twenty-five slots 64 contact the remaining twenty-five wafers and the wafers are received into the slots. The pusher rods 60 continue their upward movement until the twenty-five wafers 8 in the pusher element 62 are disposed above the rollers 112 and 142. The upward movement of the pusher 62 comprises step ten of the sequence.

The rollers 112 and 142 rotate forty-five degrees clockwise and counterclockwise, respectively, after the pusher element 62 moves the remaining wafer 8 from the rollers 112 and 142 until the rollers are generally vertically aligned. This is shown in FIG. 2C. The rotation of the rollers 112 and 142 comprises step eleven of the sequence.

After the rollers have rotated to the position shown in FIG. 2C, to their vertical orientation, the pusher rods 60 move downwardly, moving downwardly the pusher element 62 and the remaining twenty-five wafers 8. The pusher rods continue downward movement until the wafers 8 are received into the twenty-five slots in the awaiting boat 6. The pusher element 62, and the rods 60, continue to move downwardly, until they are back in the position shown in FIG. 1, their position of rest. The downward movement comprises the twelfth and final step in the sequence.

The boat 6, loaded with twenty-five wafers 8, is then removed from the aperture 24. The head 100, with its rollers 112 and 142 maintaining their generally vertical alignment, may then move to the neutral position, adjacent to the aperture 22, as shown in FIG. 1. The movements of the head 100 to and from the neutral position are extra steps not included in the above-described sequence of twelve steps. If desired, the additional movement of the head 100 may be included as two extra steps. However, since the wafers 8 are not part of these extra moves by the head 100, the extra moves to and from the neutral position at station two, adjacent to the aperture 22, are not included in the numbered steps described above and shown in the drawing.

After the wafers 8 in the boats 4 and 6 have been appropriately processed, the wafers may then be returned to or loaded in the quartz boat 2 by substantially the reversing process or steps described above. The boats 4 and 6 are placed over their apertures 22 and 24, respectively, and the head 100 moves from its neutral position at station two, adjacent to the aperture 22, to station three, adjacent to the aperture 24. During the transport move, the rollers 112 and 142 maintain their generally vertical alignment or position.

The pusher rods 60 move upwardly, and as they move upwardly through the boat 6, the pusher element 62 contacts the twenty-five wafers in the boat. The wafers 8 are received in the slots or grooves 64 of the pusher element 62. Unloading step twelve thus becomes loading step one.

As will be remembered, the slots or grooves 64 are relatively widely spaced, with the spacing corresponding to every other slot in the fifty slot pusher elements 52 and 32 and 42.

With the wafers 8 disposed within the slots 64 of the pusher head or element 62, the wafers 8 are then lifted above the rollers 112 and 142, generally to the position shown in phantom in FIG. 2C. The rollers 112 and 142 then rotate forty-five degrees counterclockwise and clockwise, respectively, so that the relatively shallow slots 122 in the rod 112 and the corresponding relatively shallow slots in the roller 142 will be ready to receive the wafers 8. The pusher rods 60 then move downwardly, taking with them the pusher element 62 and the wafers 8. As the element 62 moves downwardly, the twenty-five wafers 8 contact the shallow grooves or slots 132 and their corresponding grooves which then receive the wafers and hold them in the roller elements 112 and 142.

After the pusher element 62 is in its full downward position, the head 100 moves from station three to station two, transporting the twenty-five wafers 8 in the slots in the rollers 112 and 142. The head 100 then indexes adjacent to the aperture 22.

When the head 100 comes to rest adjacent to the aperture 22, the pusher rods 50 move upwardly, and the twenty-five wafers 8 in the boat 4 are received into alternating slots or grooves in the pusher element 52. The twenty-five wafers from the boat 4 are thus moved upwardly with the element 52 as the rods 50 move upwardly.

It will be remembered that the wafers 8 in the slots in the pusher element 52 are spaced apart in an alternating fashion, or double-width, so that there is now a wafer in every other slot in the pusher element 52. Thus, as the wafers 8 move upwardly with the element 52 and its rods 50, the newly raised wafers 8 are interleaved with the wafers 8 presently disposed within the slots of the rollers. The wafers 8 in the pusher 52 move through the relatively wide and deep rectangular slots in the rollers, such as the slots or grooves 124 of the roller 112, shown in FIGS. 3 and 5.

Continued upward movement of the element 52 causes the wafers 8 disposed in the rollers to be received into the awaiting, alternating slots in the pusher element 52. The pusher element 52 now has received all fifty of the wafers, and all fifty of the wafers 8 then move upwardly to clear the roller elements 112 and 142.

After the fifty wafers are disposed above the roller elements 112 and 142, the roller elements 112 and 142 then rotate ninety degrees clockwise and counterclockwise, respectively, so that the equally spaced V-slots, such as the V-slots 128 in the roller 112 (see FIGS. 4, 5, and 6), are in a position to receive the fifty wafers 8. The pusher element 52 then moves downwardly as its rods 50 retract and move downwardly. As the pusher element 52 moves downwardly, taking all fifty of the wafers with it, the wafers 8 move into the awaiting V-shaped slots in the rollers 112 and 142, which receive all fifty of the wafers. The wafers then remain in the rollers, and the element 52 and its rods 50 move downwardly to its position of rest, as shown in FIG. 1.

When the pusher element 52 is moved downwardly away from the rollers, and thus away from the head 100, and down to its position of rest, the head 100 then moves from the second station to the first station adjacent to the dual pusher elements 32 and 42 at the aperture 20 and the waiting quartz boat 2. All fifty of the wafers remain in the rollers 112 and 142 as the transport step is accomplished.

When the head 100 stops adjacent to the aperture 20, the pusher elements 32 and 42 move upwardly through the quartz boat 2 until the wafers 8 are received into the slots 34 and 44, respectively, of the pusher elements 32 and 42, respectively. The fifty wafers then are received into the slots and move upwardly away from the rollers 112 and 142 as the rod pairs 30 and 40 continue their upward movement, taking the pusher elements 32 and 42, and all fifty of the wafers, with them.

When the pusher elements 52 and 42 and the wafers 8 have cleared the rollers 112 and 142 and are at their maximum height, the rollers 112 and 142 move to their vertical alignment positions, shown in FIG. 2C and shown in phantom in FIG. 1. In their vertical, parallel positions, the wafers 8 are clear of the rollers, and the rollers then remain vertically oriented while the pusher elements 32 and 42 move downwardly, taking the wafers 8 downwardly between the rollers 112 and 142, and to the awaiting slots in the boat 2. The pusher rods 30 and 40 continue the downward movement, and the wafers 8 remain in the awaiting slots in the boat 2. The head 100 is then free to index to its neutral position, adjacent to the aperture 22, as shown in FIG. 1. The rollers 112 and 142 remain in their vertical or neutral position. The loaded quartz boat 2 may then be removed for the further processing of the wafers 8.

Any slight misalignment of the boats, pusher elements, or rollers, is substantially automatically compensated for by the vee grooves. That is, the vee or V-shaped grooves allow the wafers to move slightly or to vary slightly from a "pure" alignment without damaging the wafers. The apparatus with V-shaped grooves prevents lateral misalignments which could cause the wafers to fracture or otherwise break. In addition, the generally rectangular configuration of the relatively deep slots in the rollers, such as the slots 124 in the roller 112, allows the wafers to move through the rollers without physical contact with the rollers.

FIG. 11 is a schematic representation of the rear of the apparatus 10, showing the head 100 disposed above the table 12. The table 12 includes a laterally extending rear slot 26 in which a carriage 102 moves. The head 100 is in turn secured to and is movable with the carriage 102.

The carriage 102 moves on a pair of generally aligned, parallel rods 104, one of which is schematically shown in FIG. 11. Appropriate linear bearings, or the like, are used by the carriage 102 on the rods 104.

In FIG. 11, two motors are shown. A reversible motor 160 is shown within the head 100 for rotating the roller rods 110 and 140 for the rollers 112 and 142, respectively. A reversible motor 180 is shown on the carriage 102 for moving the carriage 102 and the head 100.

For moving the carriage 102 in the head 100, a belt 106 is shown secured between the sides 14 and 16 of the table 12. The belt 106 is disposed over a drive sprocket 182 and under a pair of idler sprockets 184 and 186. The drive sprocket 182 is appropriately secured to the output shaft of the motor 180. Thus, actuation of the motor 180 results in rotation of the sprocket 182. The sprocket 182 is in mesh or in contact with the belt 106, and as the sprocket 182 rotates, the carriage 102 moves along the belt 106.

The idler sprockets 184 and 186 are used to maintain appropriate tension on the belt 106 for the sprocket 182.

Appropriate elements may be used to stop the carriage 102, and the head 100 at precise locations. Elements such as microswitches, light beams, appropriately activated or interrupted, as the case may be, are some of the elements which may be used for such purposes. Obviously, such elements are well known and understood in the art.

For rotating the rollers 112 and 142, through their shafts 110 and 140, respectively, the reversible motor 160 is used. The motor 160 is directly connected to the roller shaft 110. The motor 160 is also directly connected to a gear 162. The gear 162 in turn meshes with an idler gear 164. Another idler gear 166 meshes with an idler gear 164. Another idler gear 166 meshes with both the gear 164 and with a gear 168. The gear 168 is in turn secured to the shaft 140. The purpose of the idler gears 164 and 166 is to reverse the direction of rotation of the gears 162 and 168 so that the shafts 110 and 140, and their rollers 112 and 142, respectively, rotate in opposite directions.

As with the control of the motor 180, and thus the carriage 102 and the head 100, appropriate control elements are used to control the motor 160 to in turn control the rotation of the shafts 100 and 140, and the rollers 112 and 142, respectively.

The various pusher elements, secured to the pusher rod pairs, move upwardly and downwardly preferably by reversible motors acting through belts and sprockets, comparable to the movement of the head 100. Obviously, other appropriate means may also be used, if desired, such as rack and pinion drive, pneumatic motors, etc. Moreover, various control and limit elements, such as discussed above, may be used to control the upward and downward movements of the pusher elements. And, as discussed above, the timing, sequencing, actuation, etc., of the various elements is preferably accomplished by a pre-programmed microprocessor.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted for specific environments and operative requirements without departing from those principles. The appended claims are intended to cover and embrace any and all such modifications, within the limits only of the true spirit and scope of the invention. This specification and the appended claims have been prepared in accordance with the applicable patent laws and the rules promulgated under the authority thereof.

What is claimed is:

1. Wafer transfer apparatus, comprising, in combination:

table means for providing support and having a first station and a second station;

head means movable on the table means from the first station to the second station;

means for moving the head means on the table means;

first lifting means at the first station for raising wafers to be transferred, including a first plurality of wafers and a second plurality of wafers;

second lifting means at the second station for receiving transferred wafers and for lowering the transferred wafers; and roller means secured to the head means, including a first roller and a second roller, each of which includes a plurality of slots, and the first and second rollers are rotatable to a plurality of positions, including a first position in which the spacing between the slots of the first and second rollers is sufficient to allow the wafers to move between the rollers as the wafers are lifted by the first lifting means, a second position in which the rollers receive and hold the wafers lifted by the first lifting means for transporting the wafers from the first station to the second station, and a third position in which spacing between some of the slots of the first and second rollers is sufficient to allow the second plurality of wafers held by the rollers to move downwardly to be received by the second lifting means while the spacing between the remaining slots is sufficient to continue holding the first plurality of wafers by the rollers.

2. The apparatus of claim 1 in which the plurality of slots in the first and second rollers of the roller means includes a first set of slots for receiving the wafers and for holding the wafers during the transport from the first station to the second station.

3. The apparatus of claim 2 in which the plurality of slots in the first and second rollers of the roller means further includes a second set of slots, including first relatively shallow slots for receiving and holding the first plurality of wafers and second relatively deep slots through which the second plurality of wafers move as the wafers are lowered at the second station by the second lifting means when the rollers rotate to their second position.

4. The apparatus of claim 3 in which the table means further includes a third station and third lifting means at the third station for receiving the first plurality of wafers from the roller means and for lowering the first plurality of wafers.

5. The apparatus of claim 4 in which the head means is further movable on the table means to the third station.

6. The apparatus of claim 5 in which the first set of slots receives the wafers when the roller means are in the second position.

7. The apparatus of claim 6 in which the second set of slots receives the first plurality of wafers and the second lifting means receives the second plurality of wafers when the roller means are in the third position.

8. The apparatus of claim 7 in which the third lifting means receives the second plurality of wafers when the roller means is in the first position.

9. The apparatus of claim 3 in which the first set of slots comprises a plurality of Vee-shaped slots.

10. The apparatus of claim 9 in which the second set of slots comprises a first plurality of Vee-shaped slots and a second plurality of generally rectangular slots.

11. The apparatus of claim 10 in which the first plurality of slots is interleaved with the second plurality of slots.

12. The apparatus of claim 3 in which the second lifting means includes a third plurality of slots and a fourth plurality of slots, and the third plurality of slots receives the first plurality of wafers and the fourth plurality of slots receives the second plurality of wafers.

13. The apparatus of claim 12 in which the third plurality of slots comprises relatively shallow Vee-shaped slots, and the fourth plurality of slots comprises relatively deep Vee-shaped slots.

14. The apparatus of claim 13 in which the third plurality of slots is interleaved with the fourth plurality of slots.

15. The apparatus of claim 14 in which the first slots of the roller means are aligned with the third plurality of slots of the second lifting means, and the second slots of the roller means are aligned with the fourth plurality of slots of the second lifting means.

16. The apparatus of claim 15 in which the second lifting means receives the wafers from the roller means when the first and second rollers of the roller means are in the second position and holds the wafers while the rollers move to the third position for receiving the first plurality of wafers from the second lifting means and for allowing the second plurality of wafers to remain with the second lifting means.

* * * * *